United States Patent
Tenca et al.

(10) Patent No.: US 6,703,787 B2
(45) Date of Patent: Mar. 9, 2004

(54) SIGNAL GENERATION AND CORRECTION CIRCUIT AND METHOD FOR CORRECTING DIGITAL SIGNALS

(75) Inventors: Vittorio Tenca, Caprino Veronese (IT); Ernesto Zanotti, S. Giovanni Lupatoto (IT); Andrea Bari, Verona (IT); Corrado Carradori, Pescantina (IT)

(73) Assignee: PWB-Ruhlatec Industrieprodukte GmbH (DE)

( * ) Notice: Subject to any disclaimer, the term of this patent is extended or adjusted under 35 U.S.C. 154(b) by 0 days.

(21) Appl. No.: 10/222,425

(22) Filed: Aug. 16, 2002

(65) Prior Publication Data

US 2003/0053191 A1 Mar. 20, 2003

(30) Foreign Application Priority Data

Aug. 18, 2001 (DE) .......................... 101 39 204

(51) Int. Cl.[7] .............................. H05B 41/36; G05F 1/00
(52) U.S. Cl. ...................... 315/149; 315/791; 315/11.5
(58) Field of Search .................. 315/149, 1, 291, 315/11.5, 387–388, 300; 345/46, 166; H05B 41/36; G05F 1/00

(56) References Cited

U.S. PATENT DOCUMENTS 4,355,403 A * 10/1982 Spaniol et al. .............. 375/257
4,424,413 A * 1/1984 Skobranek .................. 178/17 R
4,654,575 A * 3/1987 Castleman ............. 340/636.13
4,709,320 A * 11/1987 Konopka .................. 363/56.01
5,594,333 A * 1/1997 Whipple, III ................ 324/142
6,175,196 B1 * 1/2001 Ragner et al. .......... 315/200 A
6,316,930 B1 * 11/2001 Camin ......................... 324/97
6,414,450 B1 * 7/2002 De Wulf ..................... 315/291

* cited by examiner

Primary Examiner—Don Wong
Assistant Examiner—Trinh Vo Dinh
(74) Attorney, Agent, or Firm—Norris McLaughlin & Marcus, P.A.

(57) ABSTRACT

A Signal generation and correction circuit with an LED diode (D1) and a photo-transistor (Q1) having corresponding inputs and outputs (d1e, d1a and q1e, q1a), as well as connecting lines (1, 2) leading to current terminals (A, B). The inputs and outputs (d1e, d1a) and/or (q1e, q1a) of the diode (D1) and the photo cell (Q1) are connected so as to form a parallel circuit, wherein a resistor (R2) is arranged in the photo-transistor line (3) between the output (q1a) and the node (K) with the connecting line (2) and wherein a resistor (R1) is arranged in the line (2) between the node (K) and the current terminal (B). A transistor (Q2) is connected with its base (q2b) to the output (q1a) or the photo-transistor line (3), whereas the collector terminal (q2c) is connected via a resistor (R3) to the connecting line (1). The collector current has a value of 0 when a photo current flows in the photo transistor (Q1). A signal with a constant, adjustable magnitude is produced on the emitter side (q2e) of the transistor (Q2) in the absence of a photo current.

9 Claims, 3 Drawing Sheets

US 6,703,787 B2

SIGNAL GENERATION AND CORRECTION CIRCUIT AND METHOD FOR CORRECTING DIGITAL SIGNALS

BACKGROUND OF THE INVENTION

The invention is directed to a signal generation and correction circuit that includes an LED diode and a photo cell with corresponding inputs and outputs as well as connecting lines leading to current terminals, and to a method for correcting digital signals.

The signals are generated using simple photo transistors and more expensive mask sensors. These produce different output signals, wherein signal generators based on simple photo transistors are not capable of providing accurate signal values in the off-state and when conducting a maximum current.

Due to the ambient radiation and the particular characteristics of timing disks, presently used simple conventional photo transistors with timing disk control always require a minimum operating voltage of at least 0.1 mV, which corresponds to a minimum current of 0.1 μA for a resistance value of 1000 ohm. These values are outside the permissible tolerances for high-performance applications, for example in a computer mouse.

It is therefore an object of the invention to provide a signal generation and correction circuit which produces an output signal of a quality that is at least equivalent to that of mask sensors when using simple photo transistors.

It is further an object of the invention to provide a method for correcting signals which can be used with existing simple photo transistors, in particular in conjunction with timing disks and encoders of conventional design, to produce a constant output signal with small tolerance limits.

SUMMARY OF THE INVENTION

The object is solved by the invention in that a Signal generation and correction circuit is provided which includes an LED diode (D1) and a photo-transistor (Q1) which have corresponding inputs and outputs (d1e, d1a and q1e, q1a), as well as connecting lines (1, 2) leading to current terminals (A, B). The inputs and outputs (d1e, d1a) and/or (q1e, q1a) of the diode (D1) and the photo cell (Q1) are connected so as to form a parallel circuit, wherein a resistor (R2) is arranged in the photo-transistor line (3) between the output (q1a) and the node (K) with the connecting line (2) and wherein a resistor (R1) is arranged in the line (2) between the node (K) and the current terminal (B). A transistor (Q2) is connected with its base (q2b) to the output (q1a) or the photo-transistor line (3), whereas the collector terminal (q2c) is connected via a resistor (R3) to the connecting line (1). The collector current has a value of 0 when a photo current flows in the photo transistor (Q1), and whereas a signal with a constant, adjustable magnitude is produced on the emitter side (q2e) of the transistor (Q2) in the absence of a photo current.

Thus, the signal generation and correction circuit of the invention includes an LED diode D1, with the light of the LED diode generating a photo current in a photo transistor Q1 that is connected in parallel with the diode D1. As soon as the photo current flows, the current applied to the collector of the photo transistor Q1 flows through the photo transistor and returns via a resistor R2 via a node to the connecting line 2.

In addition the signal generation and correction circuit may also include that the connecting line (1) is divided into lines (L1) going to the diode (D1), (L2) going to the transistor (Q2) and (L3) going to a photo transistor (Q1), with the output of the photo transistor (Q1) being connected via a line (3) both with the base of the transistor (Q2) as well as via a resistor (R2) with the output of the diode (D1).

In addition, a method for signal generation and/or signal correction is provided, wherein a photo current is produced in a photo transistor (Q1) that is connected in parallel with an LED diode (D1), with photo current capable of controlling the collector current of the photo transistor (Q1) flowing through the connecting lines (1, 2). Here, a transistor (Q2) is connected as a signal generator in parallel with the photo transistor (Q1), wherein the base of the transistor (Q2) is connected with the emitter side of the photo transistor (Q1) and the collector of the transistor (Q2) is connected to the connecting line (1) via a resistor (R3).

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

In the drawings, wherein like reference numerals delineate similar elements throughout the several views.

DETAILED DESCRIPTION OF THE PRESENTLY PREFERRED EMBODIMENTS

Figure 1:
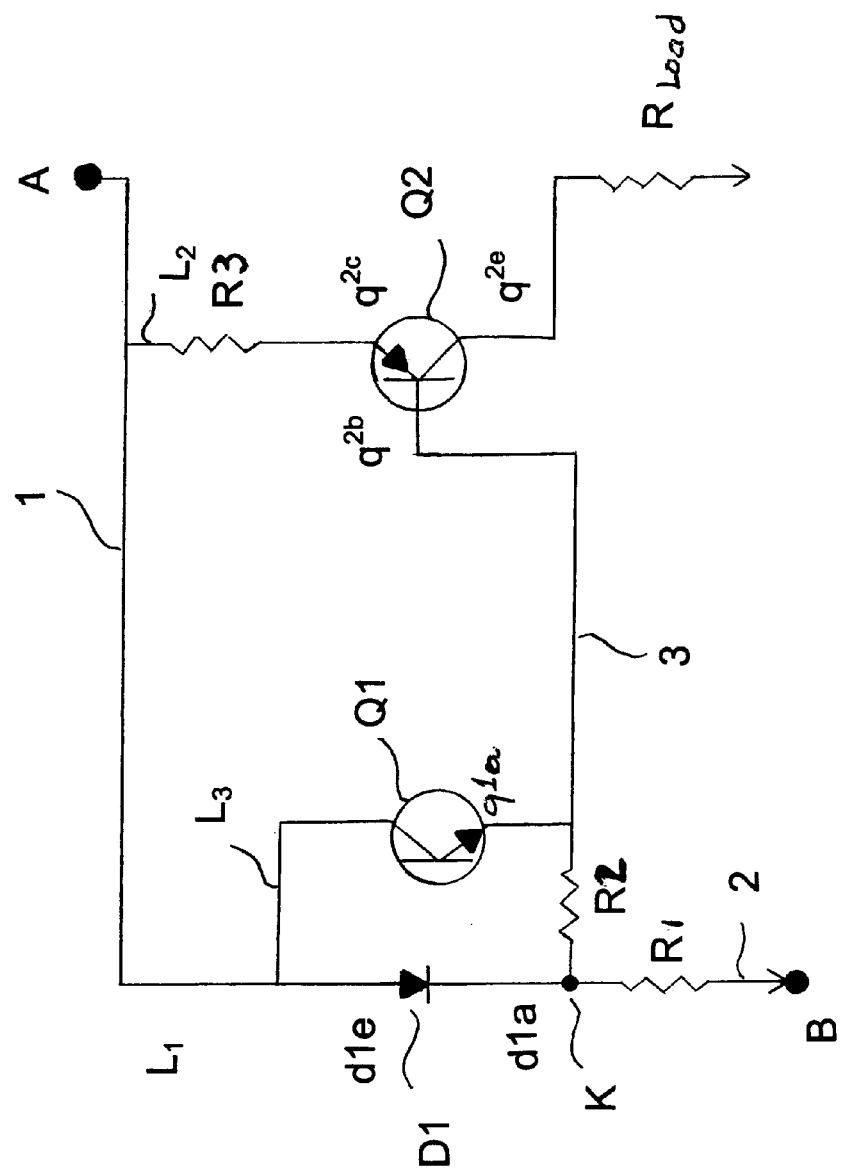
FIG. 1 shows a signal generation and correction circuit of the invention.

As illustrated in FIG. 1, the transistor Q2 is connected on the collector side to the connecting line 1 via a resistor R3 and via the base terminal to the photo transistor line 3 of the photo transistor Q1. Accordingly, in the absence of current flow in the photo transistor Q1, the current is conducted through the resistor R3 and the transistor Q2, since the residual current flows via the resistor R1 and thereby unblocks the transistor Q2.

The output signal of the transistor Q2 can be adjusted via the resistor R3 and can be held constant within narrow limits by the circuit of the invention. Experiments have shown a maximum error of 0.01 V for voltage values of, for example, 2.6 V. This also applies to the current values, wherein the minimum current value was close to 0 mA.

In general, of the produced signals exhibited good uniformity and could be easily adjusted between the lower and upper maximum value. The low cost of the employed components enables many applications in the field of signal generation and signal formation with digital electronics. Instead of the aforedescribed exemplary single photo transistor, several photo transistors connected in parallel can also be used for producing a higher current in the photo transistor line 3. This approach for signal generation or signal formation can also be combined with additional signal shaping devices, such as square wave generators. In this case, certain voltage levels have to be maintained, for example, a voltage of 0.2 to 0.4 V for the 0-level, and a voltage of 1.8 to 2.5 V for the maximum level.

Figure 2:
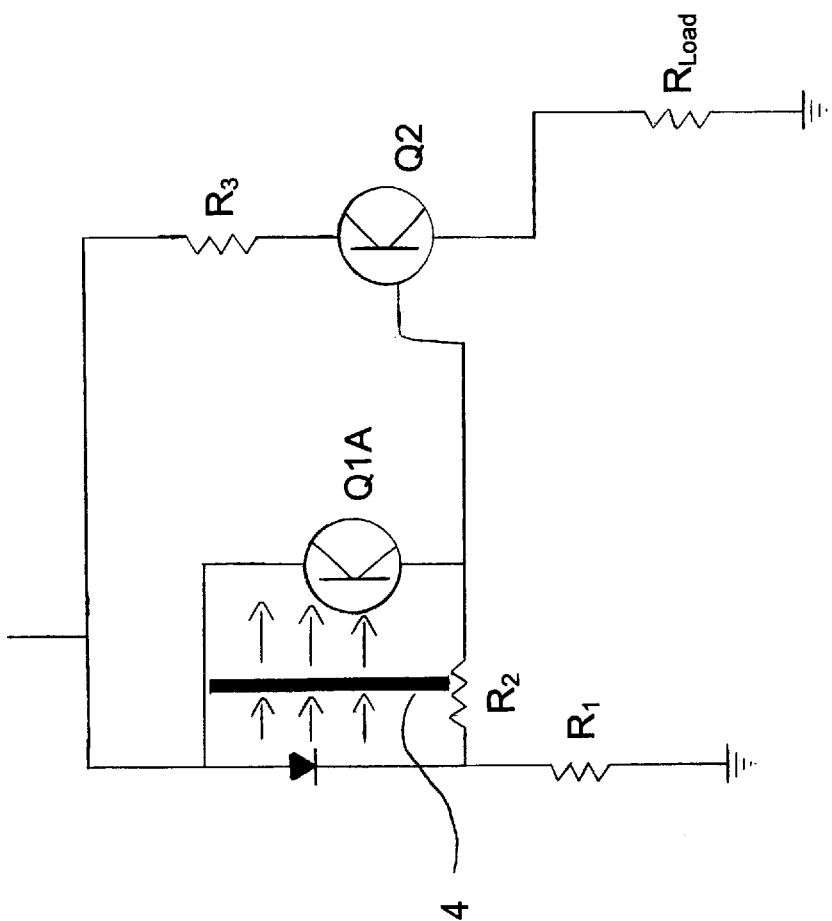
FIG. 2 shows the current flow for another embodiment with an illuminated photo transistor base.
Figure 3:
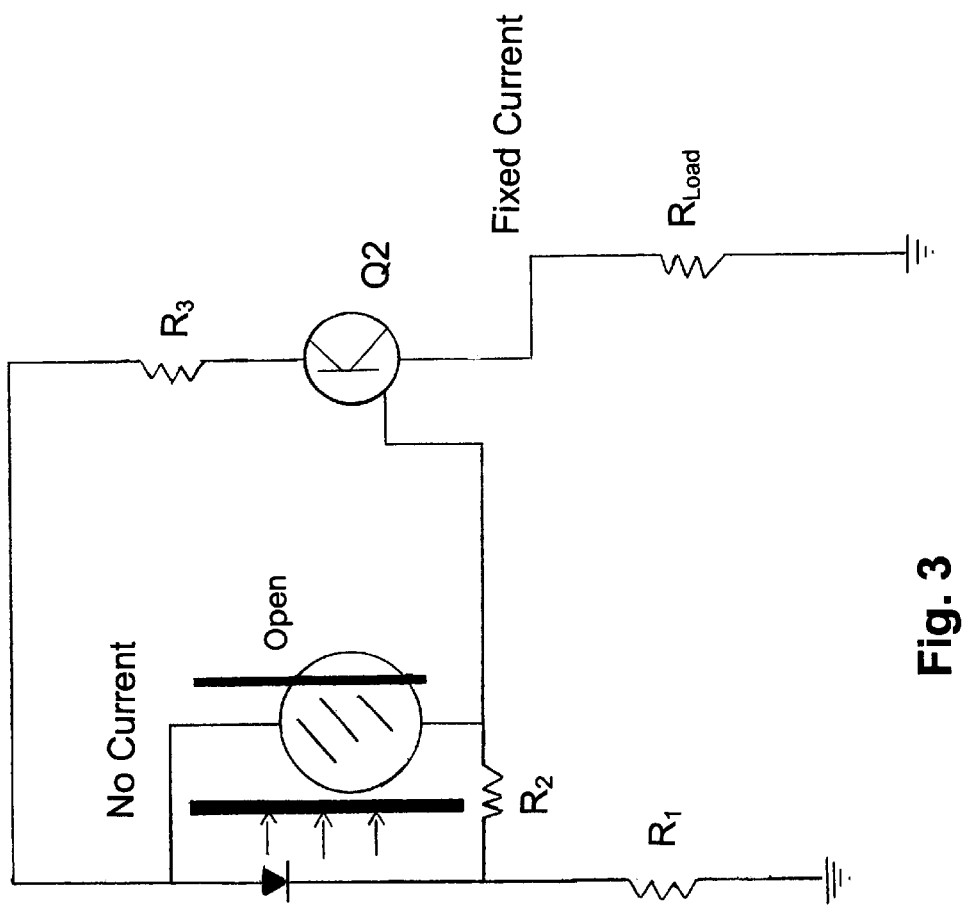
FIG. 3 shows the current flow for yet another embodiment with a dark photo transistor base.

FIGS. 2 and 3 show the current flow for an embodiment with an illuminated photo transistor base (FIG. 2) and a dark photo transistor base (FIG. 3). A timing disk 4 is shown schematically in both Figures to illustrate symbolically the process during signal generation.

As seen in FIG. 3, light from the LED diode D1 passes through the timing disk and impinges on the base of the photo transistor Q1. A current I1 is then transmitted via Q1 to the resistor R2. As a result, there is no current going to the transistor Q2 because the base voltage V is not exceeded. In the example, the base voltage of 0.6 V is not reached, so that the transistor Q2 remains in the off-state and hence no current flows via the resistor $R_{Load}$.

As also seen in FIG. 3, the light beam emitted by the LED diode D1 is interrupted by the timing disk, so that no photo current flows in the photo transistor Q1. Instead, the current flows only through the resistor R3 and R1, whereby the base voltage V=0.6 V is reached and a constant current flows through $R_{Load}$. This state is indicated in FIG. 3 by the arrow I2 (fixed current) with a current value of 2.6 mA.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

What is claimed is:

1. A signal generation and correction circuit, comprising an LED diode (D1) and a photo-transistor (Q1) having corresponding inputs and outputs (d1e, d1a and q1e, q1a), and connecting lines (1, 2) leading to current terminals (A, B), the inputs and outputs (d1e, d1a and/or q1e, q1a) of the diode (D1) and the photo transistor (Q1) are connected so as to firm a parallel circuit, wherein a resistor (R2) is arranged in a photo-transistor line (3) between the output (q1a) of the photo-transistor and a connecting node (K) with the connecting line (2), wherein a resistor (R1) is arranged in the connecting line (2) between the node (K) and the current terminal (B), wherein a transistor (Q2) is connected with its base (q2b) to the output (q1a) or the photo-transistor line (3), whereas an emitter terminal (q2c) is connected via a resistor (R3) to the connecting line (1), wherein a collector current has a value of 0 when a photo current flows in the photo transistor (Q1), wherein a signal with a constant, adjustable magnitude is produced on the emitter side (q2e) of the transistor (Q2) in the absence of a photo current, and wherein the connecting line (1) is divided into lines (L1) going to the diode (D1), (L2) going to the transistor (Q2) and (L3) going to the photo transistor (Q1), with the output of the photo transistor (Q1) being connected via the line (3) both with the base of the transistor (Q2) as well as via the resistor (R2) with the output of the diode (D1).

2. The signal generation and correction circuit according to claim 1, wherein the resistor (R3) is arranged in the line (L2), the resistor (R3) having a resistance value that corresponds to the resistance value of the resistor (R2).

3. The signal generation and correction circuit according to claim 1, wherein a switching voltage for the transistor (Q2) is greater than the voltage drop across the resistor (R2).

4. The signal generation and correction circuit according to claim 1, wherein the resistor (R1) is arranged in the voltage supply line (L1) for the diode (D1), which resistor (R1) causes a voltage drop that controls the voltage amplitude at the output of transistor (Q2).

5. A method for signal generation and/or signal correction, wherein a photo current is produced in a photo transistor (Q1) that is connected in parallel with an LED diode (D1), with photo current capable of controlling the collector current of the photo transistor (Q1) flowing through connecting lines (1, 2), comprising the steps of connecting a transistor (Q2) as a signal generator in parallel with the photo transistor (Q1), wherein a base of the transistor (Q2) is connected with the emitter side of the photo transistor (Q1) and the emitter of the transistor (Q2) is connected to the connecting line (1) via a resistor (R3), and dividing the connecting line (1) into lines (L1) going to the diode (D1), (L2) going to the transistor (Q2) and (L3) going to the photo transistor (Q1), with the output of the photo transistor (Q1) being connected via the line (3) both with the base of the transistor (Q2) as well as via the resistor (R2) with the output of the diode (D1).

6. The method according to claim 5, further comprising the step of adjusting the current ratio of collector current to base current of the transistor (Q2) by way of the resistor (R3).

7. The method according to claim 5, wherein the voltage drop across the diode (D1) is used to produce a constant generator voltage.

8. The method according to claim 5, wherein the resistance value of the resistor (R2) is dimensioned according to the required bias voltage of the transistor (Q2).

9. The method according to claim 5, wherein the resistor (R1) is dimensioned according to the required bias voltage of a LED diode (D1).

* * * * *